(12) United States Patent
Jarvinen et al.

(10) Patent No.: US 9,419,509 B2
(45) Date of Patent: Aug. 16, 2016

(54) SHARED BOOTSTRAP CAPACITOR FOR MULTIPLE PHASE BUCK CONVERTER CIRCUIT AND METHODS

(71) Applicant: Texas Instruments Incorporated, Dallas, TX (US)

(72) Inventors: Jere Andreas Mikael Jarvinen, Espoo (FI); Jarkko Antero Routama, Espoo (FI)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 197 days.

(21) Appl. No.: 14/456,745

(22) Filed: Aug. 11, 2014

(65) Prior Publication Data

US 2016/0043624 A1 Feb. 11, 2016

(51) Int. Cl.
*H02M 1/084* (2006.01)
*H02M 3/158* (2006.01)
*H03K 17/00* (2006.01)

(52) U.S. Cl.
CPC .............. *H02M 1/084* (2013.01); *H02M 3/158* (2013.01); *H02M 2003/1586* (2013.01); *H03K 17/00* (2013.01)

(58) Field of Classification Search
CPC .............................................. H02M 2003/1586
See application file for complete search history.

(56) References Cited

U.S. PATENT DOCUMENTS

| | | | | |
|---|---|---|---|---|
| 5,627,460 A * | 5/1997 | Bazinet | ................... | G05F 1/618 323/224 |
| 6,201,717 B1 * | 3/2001 | Grant | ...................... | H02M 3/07 363/131 |
| 6,362,608 B1 * | 3/2002 | Ashburn | ............. | H02M 3/1584 323/272 |
| 6,670,794 B1 | 12/2003 | Wang | | |
| 8,502,511 B1 * | 8/2013 | Kung | ................... | H02M 3/1588 323/225 |
| 8,558,526 B2 * | 10/2013 | Ishii | ..................... | H02M 3/1588 323/283 |
| 8,710,816 B2 | 4/2014 | Miyazaki | | |
| 8,970,185 B1 * | 3/2015 | Sutardja | .................. | H02M 1/08 323/266 |
| 2004/0085048 A1 * | 5/2004 | Tateishi | .............. | H02M 3/1582 323/224 |
| 2005/0073288 A1 * | 4/2005 | Harris | ................. | H02M 3/1584 323/282 |
| 2005/0102128 A1 * | 5/2005 | Wilhelm | ............ | H03K 17/6871 703/23 |
| 2005/0110556 A1 * | 5/2005 | Guedon | .................. | H03F 3/217 327/390 |

(Continued)

FOREIGN PATENT DOCUMENTS

WO    WO2014119307 A1    8/2014

OTHER PUBLICATIONS

Search Report for PCT/US15/44707, dated Dec. 3, 2015 (1 page).

*Primary Examiner* — Timothy J Dole
*Assistant Examiner* — Yusef Ahmed
(74) *Attorney, Agent, or Firm* — William B. Kempler; Frank D. Cimino (57) ABSTRACT

A multiple phase dc to dc converter with a shared bootstrap capacitor. In an embodiment, a multiple phase buck converter is disclosed including a plurality of n switching stages, each coupled to a corresponding switching node, each further including a high side driver MOS device coupled between a terminal for a positive voltage supply terminal and the corresponding switching node; and an inductor coupled in parallel between the corresponding switching node and an output terminal configured for providing the DC output voltage; and high side driver control circuitry configured to selectively couple a shared bootstrap capacitor to a gate terminal of each of the high side drivers, wherein the shared bootstrap capacitor is configured to charge a gate capacitance of each of the high side driver MOS devices. Additional embodiments are disclosed.

19 Claims, 7 Drawing Sheets

(56) References Cited

U.S. PATENT DOCUMENTS

| | | | |
|---|---|---|---|
| 2006/0044051 A1* | 3/2006 | Locatelli | G05F 1/618 327/536 |
| 2006/0238179 A1* | 10/2006 | Harris | H02M 3/1584 323/272 |
| 2007/0108952 A1* | 5/2007 | Bartolo | H02M 3/157 323/282 |
| 2008/0129259 A1 | 6/2008 | Endo | |
| 2008/0218141 A1* | 9/2008 | Lu | H03K 17/6871 323/282 |
| 2008/0258808 A1* | 10/2008 | Locatelli | H02M 7/538 327/589 |
| 2008/0278135 A1* | 11/2008 | De Lima Filho | G05F 1/575 323/288 |
| 2008/0290841 A1* | 11/2008 | Chang | H02J 7/0068 320/166 |
| 2009/0015224 A1* | 1/2009 | Hirao | H02M 3/158 323/282 |
| 2009/0179235 A1* | 7/2009 | Shiraishi | H01L 21/823487 257/288 |
| 2010/0001790 A1* | 1/2010 | Hashimoto | H01L 27/0629 327/566 |
| 2010/0013452 A1* | 1/2010 | Tang | H02M 3/156 323/282 |
| 2011/0316503 A1* | 12/2011 | Huang | H02M 3/1584 323/271 |
| 2012/0086479 A1* | 4/2012 | Carpenter | H02M 3/158 327/109 |
| 2013/0106374 A1* | 5/2013 | Ball | H02M 3/1588 323/271 |
| 2013/0200869 A1* | 8/2013 | Sasao | G05F 1/46 323/282 |
| 2013/0265024 A1* | 10/2013 | Chen | H02M 1/08 323/282 |
| 2013/0293214 A1* | 11/2013 | Chang | H02M 3/1584 323/311 |
| 2013/0308061 A1* | 11/2013 | Murakami | H02M 3/1582 348/730 |
| 2014/0015503 A1* | 1/2014 | Cheng | H02M 3/1588 323/282 |
| 2014/0043875 A1* | 2/2014 | Hsing | G05F 1/56 363/77 |
| 2014/0062450 A1* | 3/2014 | Oshima | H03K 17/08122 323/311 |
| 2014/0217959 A1 | 8/2014 | Chen et al. | |
| 2014/0300413 A1* | 10/2014 | Hoyerby | H02M 1/08 330/251 |
| 2015/0008890 A1* | 1/2015 | Sasao | H02M 1/08 323/271 |
| 2015/0042298 A1* | 2/2015 | Kung | H02M 3/1588 323/271 |
| 2015/0061611 A1* | 3/2015 | Li | H02M 3/1588 323/235 |
| 2015/0077075 A1* | 3/2015 | Knoedgen | H02M 1/088 323/272 |
| 2015/0311792 A1* | 10/2015 | Amaro | H02M 1/08 323/271 |
| 2015/0311794 A1* | 10/2015 | Khayat | H02M 3/158 323/271 |
| 2015/0311797 A1* | 10/2015 | Okamatsu | H02M 3/1582 323/271 |

* cited by examiner

SHARED BOOTSTRAP CAPACITOR FOR MULTIPLE PHASE BUCK CONVERTER CIRCUIT AND METHODS

TECHNICAL FIELD

The embodiments relate generally to the use of multiple phase switching circuits in a DC-DC switching converter for providing a stepped down voltage from an input voltage. The embodiments provide an efficient multiple phase switching converter in a buck configuration that is applicable to a variety of applications where a DC output voltage is provided from a DC input voltage.

BACKGROUND

Recent improvements for DC power supply circuits are increasingly important in portable and battery powered devices. In such devices, a supply voltage is used that is sometimes provided by an AC to DC transformer, or a "brick", which outputs a DC voltage such as 12 or 24 Volts when AC power is available. Portable devices often also operate on similar DC voltages provided from rechargeable or other batteries when AC power is not available. Some portable devices may not have a "brick" but operate only from batteries. Electronics used within the portable devices typically include integrated circuits such as a microprocessor, volatile or non-volatile storage devices, digital radio or cellphone transceiver devices, and other functions such as Bluetooth, WiFi, and display drivers. The integrated circuit devices are increasingly designed to operate at lower and lower operating voltages, such as 1.8 Volts DC or even lower. Lower operating voltages for integrated circuits consume less power and thus extend battery life. Other supply voltages such as 2.8V, 3.3V, or 5 V are sometimes used. The system supply voltage from the batteries or the AC to DC transformer or "brick" is typically higher than the voltage needed by the electronic circuitry, so a DC-DC step down converter is used.

Switching power converter circuits are increasingly used to provide the DC voltage and current needed for electronic devices. In the case of a "step down" switching converter, pulse width modulated ("PWM") converters in a "buck" configuration are often used. These PWM converter circuits are far more efficient and run cooler than the linear regulators used previously to provide the stepped down DC-DC voltage. In a buck converter, a high side switch (which may be, for example, a MOS transistor) is coupled with its current conduction path between an input voltage terminal and a switching node. A pulse width modulated signal coupled to a gate terminal of the high side switch is used to turn on or "close" the high side switch in an "on" state, and the pulse width modulated signal is used to turn off or "open" the high side switch in an "off" state. These two states alternate in a more or less constant frequency pattern. The "duty cycle" of the converter is a ratio of the "on" time of the high side switch to the "off" time. An inductor is coupled between the switching node and an output terminal for the output voltage. An output capacitor is coupled between the output terminal and a ground terminal. By closing the high side switch for the "on" state time, and driving current into the inductor during the "on" state, and then subsequently opening the high side switch for the "off" state time, current flows into the inductor and into the load, and an output voltage is developed across the load that is supported by the output capacitor. A rectifying device is also provided coupled between the switching node and a ground potential. The rectifying device is used to supply current into the inductor when the high side switch is open, the "off time" for the circuit. Increasingly this rectifying device is replaced by a low side driver switch; although diode rectifiers are sometimes used. Use of a MOSFET transistor for both the high side switch and the low side switch (replacing the older diode rectifier) creates a synchronous switching converter topology. By using MOSFET transistors with low RDSon values, and by controlling the on and off times for the high side and low side switches, efficient DC-DC buck converter circuits are implemented.

As is known to those skilled in the art, in a switching buck converter that uses a constant frequency and a duty cycle with pulse width modulation, when output current is constantly flowing to the load, the DC output voltage obtained at the output terminal is directly proportional to the input DC voltage at the voltage input terminal. More specifically, the output voltage is proportional to the input voltage multiplied by the ratio of the high side switch on-time to the off-time, that is, the DC output voltage is proportional to the duty cycle. Thus by changing the pulse width of the "on" state, the output voltage may be varied to a desired value, and it may be regulated. An onboard or off board oscillator is typically used to obtain a pulse source which clocks the circuit. Using sense resistors or other current sensors at the output along with feedback control, for example, the output voltage can then be regulated to a desired value by varying the width of the modulated pulse that closes the high side switch, thereby coupling the input voltage or a supply voltage to the switching node for the inductor. Additional circuitry is sometimes used to regulate the output during times when no current or low current is flowing into the load, for example the circuit may switch to a pulsed frequency mode or otherwise skip cycles when light load conditions are present. As an example, U.S. Pat. No. 8,710,816, issued Apr. 29, 2014, entitled "Buck Converter having Reduced Ripple under Light Load", to Miyazaki, which is co-owned with the present application, and which is hereby incorporated herein in its entirety by reference, discloses circuitry for increasing the efficiency of a buck converter circuit when operating under light load.

While the buck converter is substantially more efficient than the linear regulators used in the past to provide DC voltages, multiple phase buck converters are increasingly used to still further improve buck converter performance. In a multiple phase buck converter, several switching circuit stages and corresponding inductors are coupled in parallel to one another, and these multiple stages are operated in non-overlapping phases. The multiple phase outputs are then simply added to form the overall output. There may be two, three, four or more phases and corresponding circuit stages. However the addition of the multiple phases increases the complexity of the control circuitry, and a design trade-off thus exists between the number of phases used and the amount of and complexity of the control circuitry required.

Use of multiple phase converters advantageously decreases the undesirable ripple voltage at the output observed for single phase buck converters, and a multiphase buck converter also handles variations in the load current very well when compared to a single phase buck converter. Since modern microprocessors have many "sleep" and "power save" modes that are used to reduce the power used during idle microprocessor cycles and so extend the battery life of portable devices, the current demanded by a modern microprocessor will vary substantially. Multiphase buck converters are therefore increasingly used, particularly for supplying DC voltages in microprocessor systems.

Figure 1:
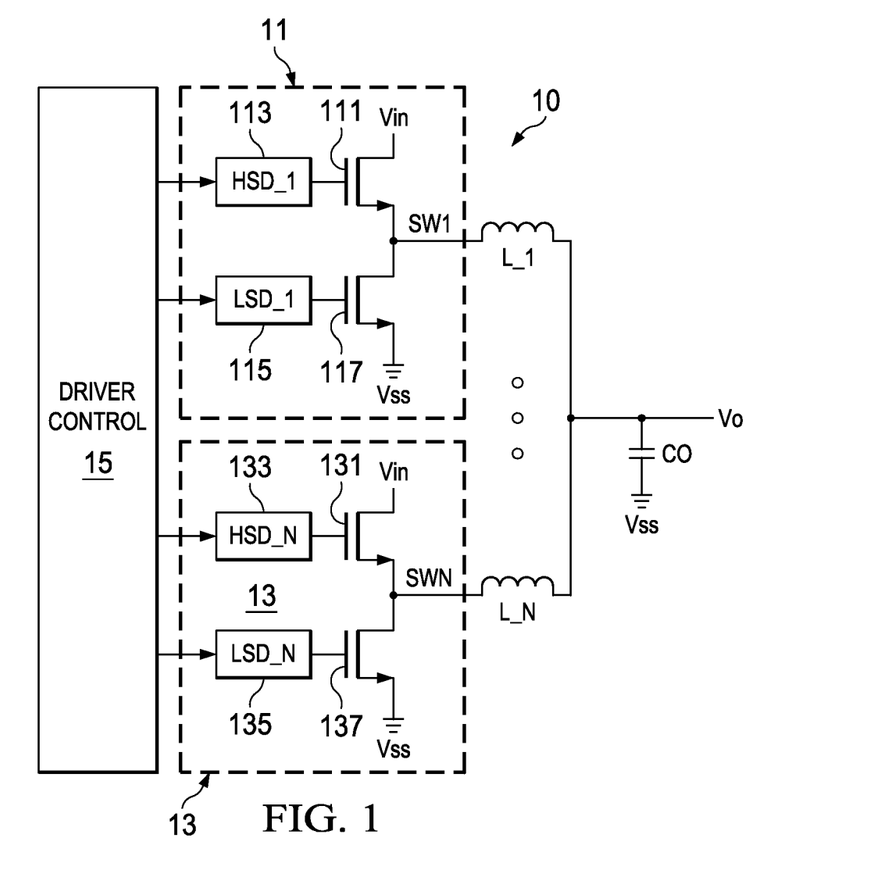
FIG. 1 illustrates in a circuit diagram a typical multiple phase buck converter circuit.

FIG. 1 depicts, for the purpose of explanation, a block diagram of a typical multiphase buck converter circuit 10. In FIG. 1, a first stage switching circuit 11 is shown with a high side MOSFET switch 111, which is an N-type MOSFET that is sufficiently large to provide the required or expected load current to the corresponding inductor L_1 during the "on" state. A high side driver circuit 113 is provided coupled to the gate terminal of the MOSFET switch 111. The high side MOSFET switch 111 is coupled to switching node SW1 which is coupled to one terminal of inductor L_1. Further, in first stage switching circuit 11, a low side switch 117, which in this example is also an N type MOSFET device 117, is coupled between the switch node SW1 and a ground terminal. Low side driver 115 controls low side switch 117 by controlling the voltage on the gate terminal of the low side switch 117. During the "off" state of the switching circuit 11, the low side switch 117 provides a current path to supply current to the inductor L_1.

In FIG. 1 the multiphase buck converter 10 has n phases, as indicated by the asterisks. In the example depicted, two phases are shown. However, in practical systems n can be any positive integer greater than or equal to two, and three and four and more phase buck converter systems are known for various applications. This is indicated in FIG. 1 by the asterisks in the column between the first stage inductor L_1 and the inductor for the bottom stage, labeled L_N.

In FIG. 1, the second stage switching circuit 13 is shown coupled in parallel to the first stage switching circuit 11. The circuit elements within second stage switching circuit 13 are duplicated from first stage switching circuit 11 and include a high side MOS switch 131, which again can be an N-type MOSFET transistor, a high side driver circuit 133 coupled to the gate terminal of the high side MOS switch 131, and a low side driver circuit 135 which is coupled to the gate terminal of the low side switch 137. The switching circuit 13 is coupled to a switching node SWN which is coupled to one terminal of the inductor L_N.

Driver control circuit 15 in FIG. 1 provides the control of the high side driver circuits 113 and 133, and of low side driver circuits 115 and 135. In operation, in a first phase the high side MOS switch 111 is closed by driving a gate voltage onto the gate terminal from the high side driver circuit 113 that exceeds the source voltage by a transistor threshold voltage Vt for the high side MOS switch, transistor 111. This action "closes" the high side MOS switch 111 and couples the input voltage Vin to the switching node SW1. Current flows into the inductor L_1 and out to the output node, charging capacitor CO and the load current flows forming an output voltage at the output Vo. During this "on" state, inductor L_1 stores energy in a magnetic field surrounding the inductor. After the "on" state ends, the driver control circuit 15 controls the high side driver circuit 113 and turns off the high side MOSFET switch 111, and the driver control circuit 15 controls low side driver circuit 115 and turns on the low side switch, MOSFET 117. The low side switch 117 provides a current path during the "off" state of the first stage switching circuit 11, so that current flows through the inductor L_1 from the stored energy and into the capacitor CO and into the load (not shown) at the output terminal Vo, thus supporting the voltage at the output terminal Vo during the "off" state.

The second stage switching circuit 13 is operated in the same fashion as the first stage switching circuit 11, but the two stages are operated in non-overlapping phases. In this fashion, the output current provided by the two phase switching circuits 11 and 13 is added at the output Vo and together the two switching circuits 11 and 13 provide the current to the load. Driver control circuit 15 provides the pulses needed to turn on the high side driver circuits 113 and 133 for the high side MOS switches 111 and 131, and to turn on the low side switches 117 and 137, in non-overlapping phases.

In order to turn on the high side MOS switches 111 and 131, a voltage at the gate terminal of the MOS transistors that is higher than the input voltage is needed. In prior known approaches, this gate voltage has been formed using a bootstrap capacitor. Sometimes this capacitor is referred to as a "fly cap", but for the descriptive purposes of this disclosure, the term "bootstrap capacitor" is used. The bootstrap capacitor is first configured with a top plate coupled to a positive supply voltage, such as an internally regulated voltage Vdd, and a bottom plate coupled to a ground potential. In this manner the bootstrap capacitor is charged to the supply voltage level. The bootstrap capacitor is later coupled so that the bottom plate is at the positive input voltage VIN and the top plate is coupled to the high side switch gate. The voltage at the high side switch gate is thus "bootstrapped" to a voltage that is the sum of the positive supply voltage and the input voltage VIN at the bottom plate. In this manner the gate voltage needed for turning on the high side MOS switches 111, 131 can be developed.

In a conventional multiple phase buck converter using a bootstrap capacitor to provide the needed gate voltage at the high side MOS switch, each switching circuit stage needs an individual bootstrap capacitor. Further, the high side switch devices, which are N-type MOSFET transistors, have a large gate capacitance. The bootstrap capacitor required for each stage is therefore also quite large as it needs to charge the gate capacitor of the high side MOS switch. The use of a multiple phase buck converter configuration as known in the prior art thus requires multiple large bootstrap capacitors. If these bootstrap capacitors are integrated with the high side switches and low side switches in a converter integrated circuit, the amount of silicon area required for the bootstrap capacitors may make the multiple phase buck converter circuit too large to be fabricated on a single device that is to be manufactured in a certain semiconductor process. Alternatively, if the bootstrap capacitors are instead provided as external components coupled to an integrated circuit, the use of the multiple bootstrap capacitors requires two external pins for each of these added components. The extra pins which may undesirably increase pin count for the converter integrated circuit, and correspondingly, increase packaging and other manufacturing costs. This may lead to a situation where the needed pins are simply not available. Further the use of multiple large external bootstrap capacitors undesirably increases the board area required for implementing the multiple phase DC-DC buck converter.

Improvements in multiple phase buck converters are therefore needed to address the deficiencies and disadvantages of the known prior approaches.

SUMMARY

In the embodiments, multiple phase buck converter circuits are implemented including a shared bootstrap capacitor coupled to at least two high side switches. In one example embodiment, a buck converter for producing a DC output voltage from a DC input voltage is provided including a plurality of n switching stages, each coupled to a corresponding switching node. In this embodiment, each of the n switching stages also includes a high side MOS switch coupled between the positive input voltage and the corresponding switching node; a low side MOS switch coupled between the corresponding switching node and a ground terminal; an inductor corresponding to each of the n switching stages coupled in parallel between the corresponding switching node and an output terminal and configured for providing the DC output voltage; and high side driver circuitry for selectively coupling a shared bootstrap capacitor to a gate terminal of each of the high side MOS switches within each of the n switching stages, wherein the bootstrap capacitor is configured to charge a gate capacitance of each of the high side MOS switches.

In another embodiment, an integrated circuit configured to provide a DC to DC voltage converter in a buck configuration is provided and includes a plurality of n switching stages having n switching node outputs. In this embodiment, each of the plurality of n switching stages further includes a high side N MOS switch device having a gate terminal and being coupled between a positive input voltage and the corresponding switching node output; a low side N MOS switch device having a gate terminal and coupled between the corresponding switching node output and a ground terminal; a high side driver that selectively couples a top plate of a bootstrap capacitor to the gate terminal of the high side N MOS switch device responsive to a control input; and high side driver control circuitry coupled to the control input of the high side driver of each of the n switching stages. In this manner the bootstrap capacitor is shared between the n switching stages.

In the above embodiments, n is a positive integer and greater than or equal to two, such as two, three, four and greater numbers.

In another embodiment, a method includes coupling a plurality of n switching stages to n switching output nodes, each of the n switching stages including a high side N MOS switch coupled between a positive input voltage and a corresponding one of the n switching output nodes and each high side N MOS switch having a gate terminal, and each of the n switching stages further including a low side N MOS switch coupled between the corresponding one of the switching output nodes and a ground potential. The method embodiment continues by charging a shared bootstrap capacitor by coupling a top plate of the bootstrap capacitor to a positive supply voltage while coupling a bottom plate of the bootstrap capacitor to a ground potential; and subsequently coupling the bottom plate of the charged shared bootstrap capacitor to a positive input voltage while simultaneously coupling the top plate of the charged shared bootstrap capacitor to a gate terminal of a selected one of the high side N MOS switch devices within a selected one of the n switching stages. In this manner the shared bootstrap capacitor is operated so as to provide a voltage greater than the positive supply voltage on the gate terminal of the selected high side N MOS switch and thereby turns on the selected high side N MOS switch. Additional embodiments are also disclosed.

BRIEF DESCRIPTION OF THE DRAWINGS

For a more complete understanding of the illustrative embodiments described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The making and using of example illustrative embodiments are discussed in detail below. It should be appreciated, however, that the embodiments provide many applicable inventive concepts that can be embodied in a wide variety of specific contexts. The specific embodiments discussed are merely illustrative of specific ways to make and use the various embodiments, and the examples described do not limit the scope of the specification, or the scope of the appended claims.

For example, when the term "coupled" is used herein to describe the relationships between elements, the term as used in the specification and the appended claims is to be interpreted broadly, and is not to be limited to "connected" or "directly connected" but instead the term "coupled" may include connections made with intervening elements, and additional connections may be used between any elements that are "coupled".

Figure 2:
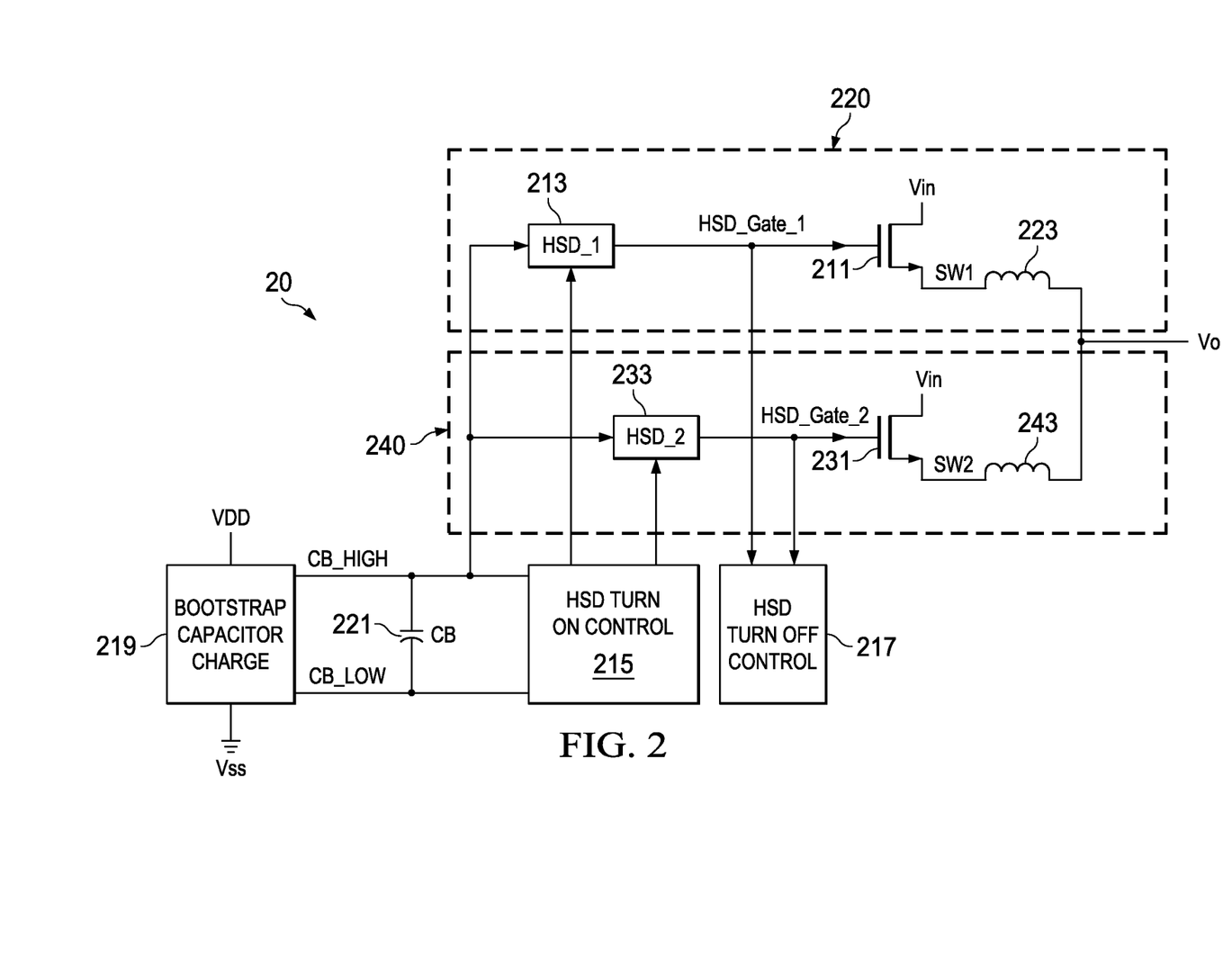
FIG. 2 illustrates in a block diagram a portion of a high side driver circuit of the embodiments.

FIG. 2 illustrates in a simplified circuit diagram the high side circuit portion 20 of a multiple phase buck converter of the embodiments. In FIG. 2, a first switching stage 220 includes the high side driver circuit 213 labeled "HSD_1" which is coupled to a node labeled "HSD_Gate_1" at the gate terminal of the high side MOS switch 211, which is an NMOS transistor. The high side MOS switch 211 has its source to drain current path coupled between the input voltage Vin, and a switching node SW1.

Further in FIG. 2, a second switching stage 240 includes the high side driver circuit 233 labeled "HSD_2" which is coupled to the node labeled "HSD_Gate_2" that is the gate terminal for high side MOS switch 231. High side MOS switch 231 has its source to drain current path coupled between input voltage Vin and a switching node SW2. In this example embodiment, there are n switching stages, with the indice n equal to two, but in other examples n may be greater than two and may be a positive integer such as three, four, etc. Each of the n switching stages will include a high side MOS switch coupled to a corresponding switching node, and a high side driver circuit, such as is shown in FIG. 2.

Each of the switching nodes SW1, SW2 will also have a corresponding inductor coupled to the switching node, shown in FIG. 2 as inductors 223, and 243, for stage 220, and stage 240, respectively. The inductors 223, 243 for each of the stages are then coupled in parallel and to a voltage output node Vo, and an output capacitor (not shown) is also coupled to the voltage output node as discussed above.

The high side driver circuits 213 and 233 are controlled by the HSD Turn On Control circuit 215. In FIG. 2, there is also illustrated a HSD Turn Off Control circuit 217. The HSD Turn Off Control circuit 217 discharges the gate terminals of the high side MOS switches 211 and 231 to turn off the MOS switches at the end of an "on" stage operation.

In FIG. 2, a single bootstrap capacitor 221, labeled CB, is shown coupled to the HSD Turn On Control circuit 215, and also, coupled to a Bootstrap Capacitor Charge circuit 219.

Advantageously, in the embodiments, a shared bootstrap capacitor is used for the multiple switching stages. In sharp contrast to the prior approaches, the embodiments enable a single bootstrap capacitor to provide the boosted voltage required at the gate terminals of each of the high side MOS switches for each of the n switching stages of the multiphase buck converter. Because only a single bootstrap capacitor is needed, the silicon area needed to implement the multiphase converter is greatly reduced. Alternatively, if bootstrap capacitor 221 is coupled as an external circuit component, the number of pins needed for the bootstrap function is only two. Use of a shared external bootstrap capacitor forms additional embodiments that are contemplated as alternative embodiments herein and which are within the scope of the appended claims.

The size of the bootstrap capacitor 221 is determined in part by the gate capacitance of the high side MOS switches such as 211, 231 in FIG. 2. The bootstrap capacitor 221 must be sufficiently large to charge the gate capacitance of these N-type MOS devices, which are also sized to be large enough to carry the current to the load from the positive input voltage Vin. In one example, the bootstrap capacitor had a value of 1.2 nanoFarads, or 1.2 nF, which is quite large for an integrated circuit capacitor. By using a single shared bootstrap capacitor for a multiple phase buck converter, the embodiments advantageously overcome the deficiencies and disadvantages of the known prior approaches.

In operation, buck converter circuit 20 of FIG. 2 first performs an initial charging phase for the bootstrap capacitor 221. During a bootstrap capacitor charging phase, the bootstrap capacitor 221 has a supply voltage (here shown as VDD) coupled to the top plate at node CB_HIGH and a ground potential is coupled to the bottom plate at node CB_LOW until the bootstrap capacitor is charged to the supply voltage. The supply voltage may be provided by an internal voltage regulator such as a low drop out regulator. Alternatively, the supply voltage VDD may be provided externally by a similar regulator circuit, or in yet another alternative embodiment, the supply voltage may be provided directly from the positive input voltage Vin. Subsequently, in a high side driver turn on phase, the charged bootstrap capacitor 221 is decoupled from the supply voltage. The charged bootstrap capacitor 221 is then coupled with the bottom plate at node CB_LOW placed at a positive input voltage such as Vin, and the top plate at node CB_HIGH coupled to the gate of a selected one of the high side MOS switches one of the n switching stages. Because the bootstrap capacitor voltage is now added to the positive input voltage, the voltage at the gate terminal of the selected high side MOS switch is boosted or "bootstrapped" to a potential higher than the input voltage. That is the gate terminal receives the "bootstrapped" voltage that is the sum of the stored voltage stored on the capacitor and the positive input voltage Vin that is now placed at the bottom plate of the charged bootstrap capacitor. The high side MOS switch gate capacitance is thus charged with the bootstrapped voltage. This action turns on the high side MOS switch, which in this example embodiment is an NMOS transistor. To couple the top plate of the bootstrap capacitor 221 to the gate terminal of the high side MOS switch 211, for example, high side driver circuit 213, labeled HSD_1, is controlled by the HSD Turn On Control circuit 215.

Following the turn on of the selected high side MOS driver, the MOS switches 211, 231 will remain on (or closed, to use switch terminology) until the gate capacitance is discharged by the HSD Turn Off Control circuit 217. Meanwhile, the HSD Turn On Control circuit 215 can decouple the bootstrap capacitor 221 CB from the selected switching stage, by controlling the high side driver circuit such as 213. Bootstrap Capacitor Charge circuit 219 can again then perform a capacitor charging phase to recharge the bootstrap capacitor 221. The high side driver turn-on sequence is then repeated for another switching stage, in this example using high side driver circuit 233, and thus the single bootstrap capacitor 221 CB is shared among the n switching stages. Surprisingly the need for individual bootstrap capacitors for each switching stage, as required in the prior known approaches, is advantageously eliminated by use of the embodiments. The elimination of the individual bootstrap capacitors for each phase of the multiple phase buck converter saves silicon area, and advantageously reduces the component count for the circuitry.

Figure 3:
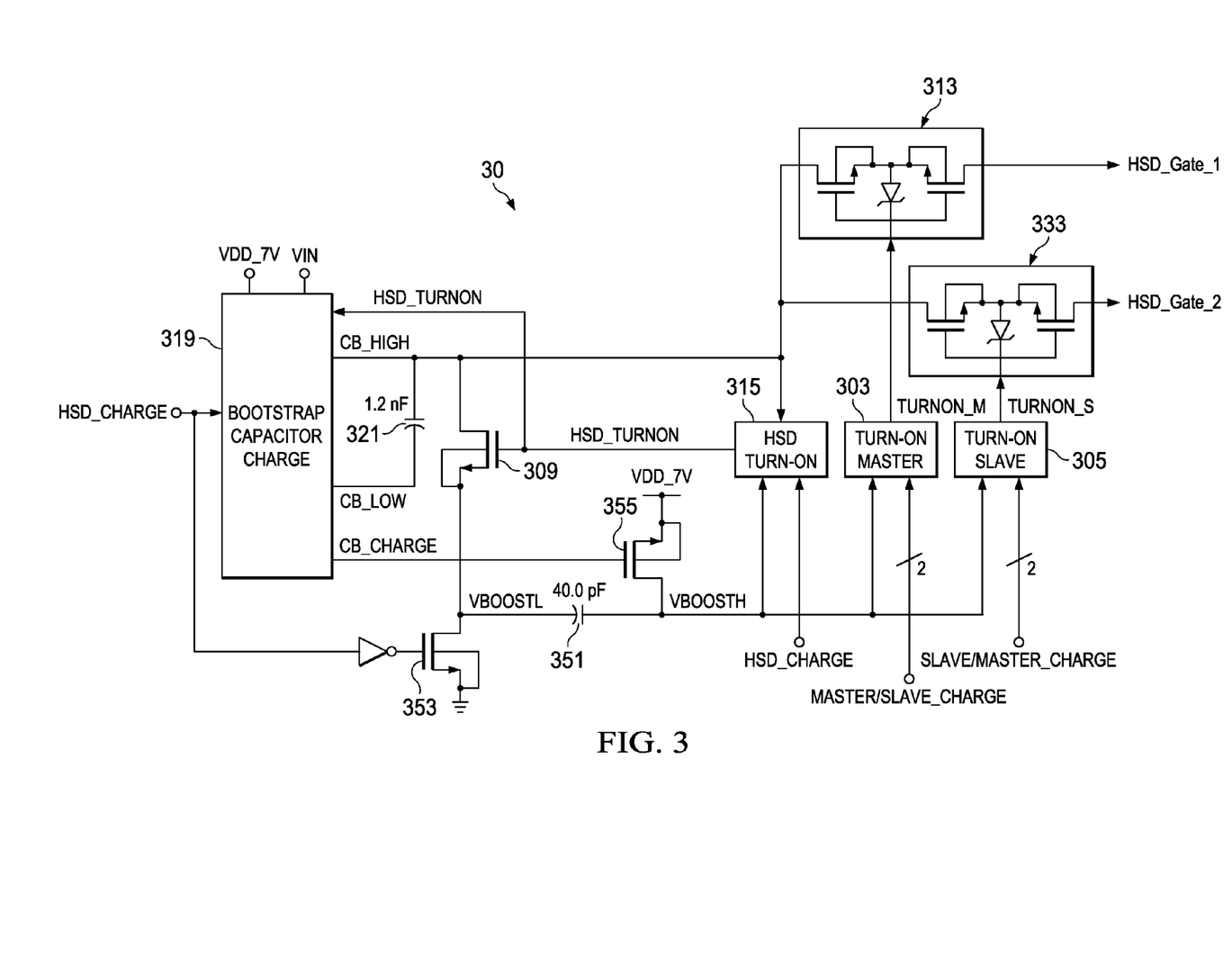
FIG. 3 illustrates in a circuit diagram a high side driver circuit of the embodiments.

In FIG. 3, a portion of an example implementation for a high side driver 30 of an embodiment is shown in a circuit diagram. High side driver circuits 313 and 333 are coupled to high side MOS switch gate nodes that are labeled HSD_Gate_1 and HSD_Gate_2, respectively. These gate signals are then coupled to the gate terminals of the high side MOS switches (not shown here, for simplicity) as described above with respect to FIG. 2. The high side driver circuits 313 and 333 are controlled by the TURN-ON MASTER and TURN-ON SLAVE circuits 303 and 305, respectively. In FIG. 3, another circuit 315 labeled "HSD TURN-ON" outputs a control signal labeled "HSD_TURNON". A shared bootstrap capacitor 321 is coupled as described above. In this non-limiting example embodiment, the bootstrap capacitor 321 has a value of 1.2 nF. However the bootstrap capacitor value can vary greatly depending on the application. The size of the bootstrap capacitor is determined by the gate capacitance of the high side MOS switch transistors, which is proportional to the size of the MOS switch transistors. The size of the MOS switch transistors is large enough to supply the current needed from the positive input voltage Vin to the load. The use of the embodiments allows a single large bootstrap capacitor to be shared among many stages of a multiphase converter, thus advantageously allowing surprisingly large capacitor values to be used on an integrated circuit, or surprisingly limits the number of pins needed for external capacitors for an integrated circuit that implements a multiphase converter.

In the embodiment illustrated in FIG. 3, the high side driver circuits 313 and 333 are each advantageously implemented using a pair of back to back, series coupled NMOS transistors. Using these NMOS transistors as the high side driver circuits provides several advantages. The series coupled NMOS pair provides an efficient way to decouple the bootstrap capacitor from the gate of the high side MOS switches without discharging the gate capacitance of the high side MOS switches. In this manner, the bootstrap capacitor 321 can be recharged by decoupling it from the gate of the high side MOS switch, while the high side MOS switch is still turned on, and without disturbing the gate capacitance charge at the high side MOS switch. This advantageously allows recharge of the bootstrap capacitor 321 in preparation for use in driving the next stage of the switching circuits during an "on" state of the high side MOS switch. Further, in some operations the high side switch may be closed more or less continuously, and use of the back to back series coupled NMOS pair advantageously allows the high side MOS switch to remain turned on, or closed, even while the bootstrap capacitor is simultaneously being recharged.

The high side driver circuits 313 and 333 require a turn on voltage that is greater than a NMOS transistor threshold voltage, multiplied times two, over the supply voltage. In the embodiment of FIG. 3, this turn on voltage is advantageously created using a second shared bootstrap capacitor circuit. Capacitor 351, which in this example embodiment has a value of 40 picoFarads, or pF, is shown with a bottom plate at node VBOOSTL and a top plate at node VBOOSTH. In this example embodiment, this capacitor 351 is also shared. The top plate at node VBOOSTH is coupled to each of the turn on circuits 315, 303 and 305. A pair of transistors 353 and 355 selectively couples the capacitor 351 between a positive supply voltage VDD and a ground terminal. During a capacitor charge phase, the capacitor 351 is charged to the supply voltage, which is shown in this embodiment as VDD_7V or 7 Volts. Later, the bottom plate of the capacitor 351, labeled VBOOSTL, may be coupled by the transistor 309 to the top plate of the bootstrap capacitor 321, labeled CB_HIGH, and the top plate of capacitor 351, labeled VBOOSTH, is then raised to a voltage greater than CB_HIGH. Since during a turn on phase CB_HIGH is greater than the supply voltage, the voltage VBOOSTH is raised to still a greater voltage, and turns on the selected high side driver circuit 313, 333. The use of the back to back series coupled NMOS transistors in the high side driver circuits 313, 333 makes for fast switching to quickly couple the gate of the high side switches, at nodes HSD_Gate_1 and HSD_Gate_2, to the top plate of the bootstrap capacitor 321. The selected one of the high side driver circuits 313, 333 will turn on immediately when the top plate of the capacitor 351 begins to rise. The high side driver circuits 313, 333 provide a low resistance current path with little loss. Further, the high side driver circuits 313, 333 allow the bootstrap capacitor 321 to be isolated from the high side switch NMOS devices while the high side switch NMOS devices are still active, allowing recharging of the bootstrap capacitor even during an "on" state. This advantageously enables the use of the bootstrap capacitor even if the high side switches are on continuously, during 100% duty cycle operations, for example.

In FIG. 3, Bootstrap Capacitor Charge circuit 319 couples the bootstrap capacitor 321 between a positive supply voltage and a ground potential during a capacitor charging phase. In FIG. 3, this internally regulated voltage is labeled VDD_7V, and is about seven volts. However other internal and external supply voltages could be used instead. Alternatively, the positive input voltage at the input voltage terminal Vin could be used. Subsequently, the bottom plate of the bootstrap capacitor 321, labeled CB_LOW, is coupled to the input voltage Vin and the top plate of the bootstrap capacitor, labeled CB_HIGH, is coupled to one of the high side MOS switch gate terminals HSD_Gate_1 or HSD_Gate_2, by the respective one of the high side driver circuits 313, 333.

Figure 4:
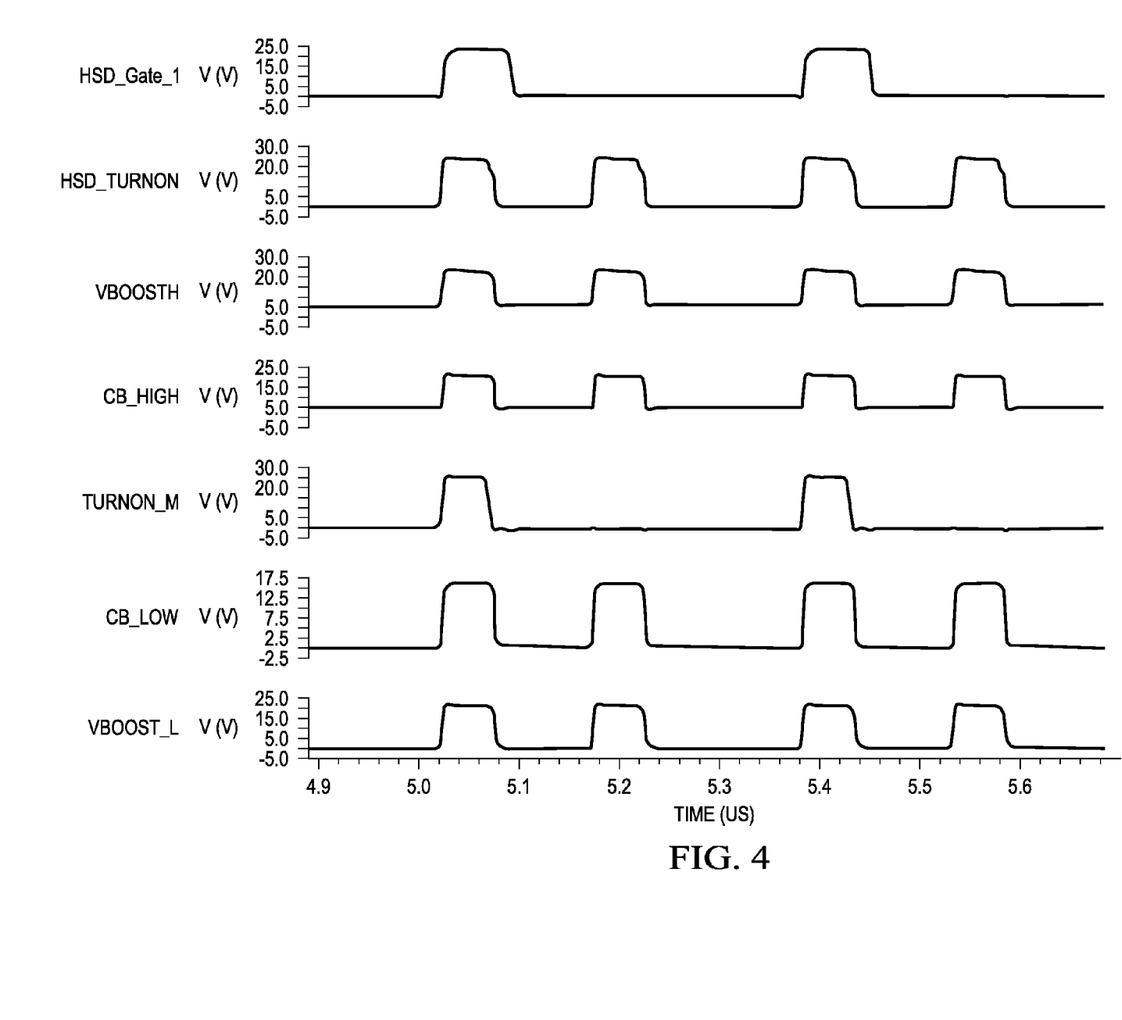
FIG. 4 illustrates in a timing diagram the operation of selected signals in the circuit of FIG. 3.

FIG. 4 depicts a timing diagram for selected nodes of the high side driver circuit 30 of FIG. 3. In FIG. 4, the top trace corresponds to the voltage at the node labeled HSD_Gate_1 in FIG. 3, which is coupled to the gate terminal of a high side MOS switch (not shown in FIG. 3). The second trace from the top corresponds to the signal HSD_TURNON in FIG. 3, which is output by the HSD TURN-ON circuit 315. The third trace from the top corresponds to the top plate of the capacitor 351, labeled VBOOSTH in FIG. 3. The fourth trace from the top corresponds to node CB_HIGH, the top plate of the bootstrap capacitor 321 in FIG. 3. The fifth trace from the top of FIG. 4 corresponds to the node labeled TURNON_M in FIG. 3 which controls the high side driver circuit 313. The sixth trace from the top of FIG. 4 corresponds to the node CB_LOW in FIG. 3, which is the bottom plate of the bootstrap capacitor 321. The bottom trace in FIG. 4 corresponds to the node VBOOST_L in FIG. 3, which is the bottom plate of the capacitor 351.

In FIG. 4, the timing diagram illustrates the high side driver circuit 30 of FIG. 3 operating over two cycles. Time (in microseconds) is displayed on the horizontal axis, and is shown at the bottom of FIG. 4. At time 4.9, a capacitor charge phase is shown. The bottom plate of the bootstrap capacitor, CB_LOW, is shown at approximately zero volts or ground. The top plate of the bootstrap capacitor CB_HIGH is shown at the internal VDD supply voltage or about 7 Volts during the same time period. Similarly, the bottom plate of the capacitor 351, VBOOSTL, is shown at time 4.9 at about zero volts. The top plate of the capacitor 351, VBOOSTH, is shown at a voltage of about 7 Volts, at the same time. Thus, the two capacitors are charged to the internal supply voltage level during the capacitor charge phase.

At time 5.02 on the horizontal scale, a high side driver turn on phase begins. The control signal HSD_TURNON is output by the HSD TURNON circuit 315 in FIG. 3. The Bootstrap Capacitor Charge circuit 319 then couples the input voltage Vin to the bottom plate of the bootstrap capacitor 321, node CB_LOW, which rises to that voltage, in this example CB_LOW rises to around 17 Volts at time 5.02. Node CB_HIGH in FIG. 4 illustrates the voltage at the top plate of the bootstrap capacitor 321, and it now rises to the bootstrapped voltage of around 22 volts at time 5.02.

The second shared capacitor 351 also provides a boosted voltage. The bottom plate of capacitor 351, node VBOOSTL in FIG. 3, is shown in the timing diagram as being raised to the same voltage as node CB_HIGH at time 5.02. In FIG. 3, transistor 309 couples the bottom plate of capacitor 351 to the node CB_HIGH in response to a high voltage on control signal HSD_TURNON as shown in FIG. 3. Node VBOOSTH is shown at time 5.02 in FIG. 4 as rising to the boosted level of around 22 Volts. In FIG. 4, node TURNON_M rises at time 5.02 in response to the signal VBOOSTH rising. This boosted voltage is coupled to the shared gate terminal of the series coupled NMOS transistors within the high side driver circuit 313, and turns them on. In FIG. 4, the output signal HSD_Gate_1 is shown rising to a high voltage at time 5.02 in response to the control signal TURNON_M rising at the gate terminal of the high side driver circuit 313.

At time 5.08 in FIG. 4, the control signal HSD_TURNON falls. The bootstrap capacitor and the capacitor 351 then both enter a charge phase once again. The control signal TURN-ON_M also falls at time 5.08. However, the gate signal HSD_Gate_1 remains high until time 5.1. The gate capacitance of the high side MOS switch is large enough to keep the gate charged after the high side driver 313 is turned off. In this manner, the use of the embodiments advantageously allows a charge phase of the bootstrap capacitor 321 to begin, even while the high side MOS switch is still turned on.

In FIG. 4, a second phase operation is illustrated at time 5.16. However in this operation the control signal TURN-ON_M does not rise in response. That is because this second phase operation is for the gate signal HSD_GATE_2 in FIG. 3, which is not plotted in the timing diagram in FIG. 4. In this manner it can be seen that the shared bootstrap capacitor 321 and the capacitor 351 is used for each of the n switching stages, and each of these capacitors is shared among the stages. At time 5.38 the pattern repeats. Two complete cycles are shown in the timing diagram of FIG. 4.

Figure 5:
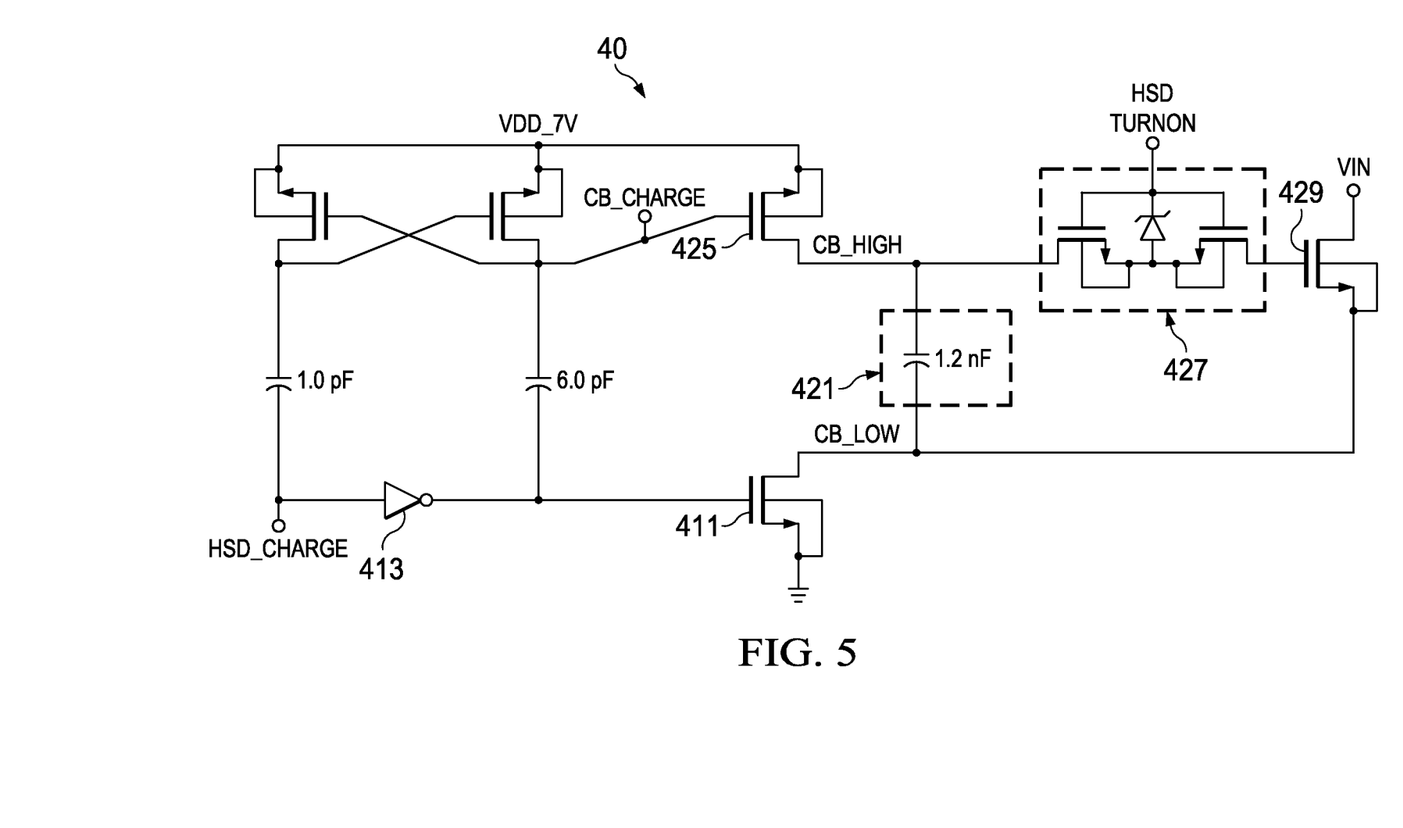
FIG. 5 illustrates in a circuit diagram an embodiment capacitor charging circuit.

FIG. 5 depicts in an embodiment a non-limiting example implementation for a Bootstrap Capacitor Charge circuit 40, similar to circuit 319 in FIG. 3. Other circuit implementations could be arranged for use with the embodiments.

In FIG. 5, the circuit 40 has input signals HSD_CHARGE and HSD_TURNON. When the HSD_CHARGE signal is low, for example, the gate of transistor 411 is at a high voltage due to the operation of inverter 413. The bottom plate of the bootstrap capacitor 421 is thus coupled to ground by transistor 411. Similarly, the node CB_CHARGE at the gate of transistor 425 is at a high level, the transistor 425 therefore couples the supply voltage VDD_7V to the top plate of the bootstrap capacitor 421, CB_HIGH. In this manner the bootstrap capacitor is charged. Note that the signal CB_CHARGE is also high at this time, as shown in FIG. 3; this signal can be used to enable charging of the second bootstrap capacitor such as 351 in FIG. 3.

In FIG. 5, the HSD_TURNON signal is coupled to another back to back series coupled pair of NMOS transistors, numbered 427. When the control input signal HSD_TURNON is at a high voltage, the voltage at the gate of transistor 429 is coupled by the circuit 427 to the voltage at CB_HIGH and will begin to turn on. Voltage VIN is then coupled to the bottom plate of the bootstrap capacitor 421 and the top plate CB_HIGH will be then be "bootstrapped" to the higher voltage, the sum of voltage VIN and supply voltage VDD_7V, as discussed above.

When the control signal HSD_CHARGE in FIG. 5 rises, indicating a high side driver turn on phase is beginning, the transistors 425 and 411 will have a low signal at the gate inputs, and thus these transistors will turn off and isolate the bootstrap capacitor 421 from the voltage VDD_7V and the ground terminal. When the signal HSD_TURNON goes high, the bottom plate of the bootstrap capacitor 421 will rise to the voltage VIN and the top plate of the capacitor 421 will rise to the bootstrapped voltage, as described above. By first coupling the bootstrap capacitor to the supply voltage, charging the bootstrap capacitor, and then decoupling the bootstrap capacitor from the supply voltage, and then coupling the bottom plate to the input voltage VIN, the circuit 40 efficiently provides a bootstrapped voltage at the node CB_HIGH.

Figure 6:
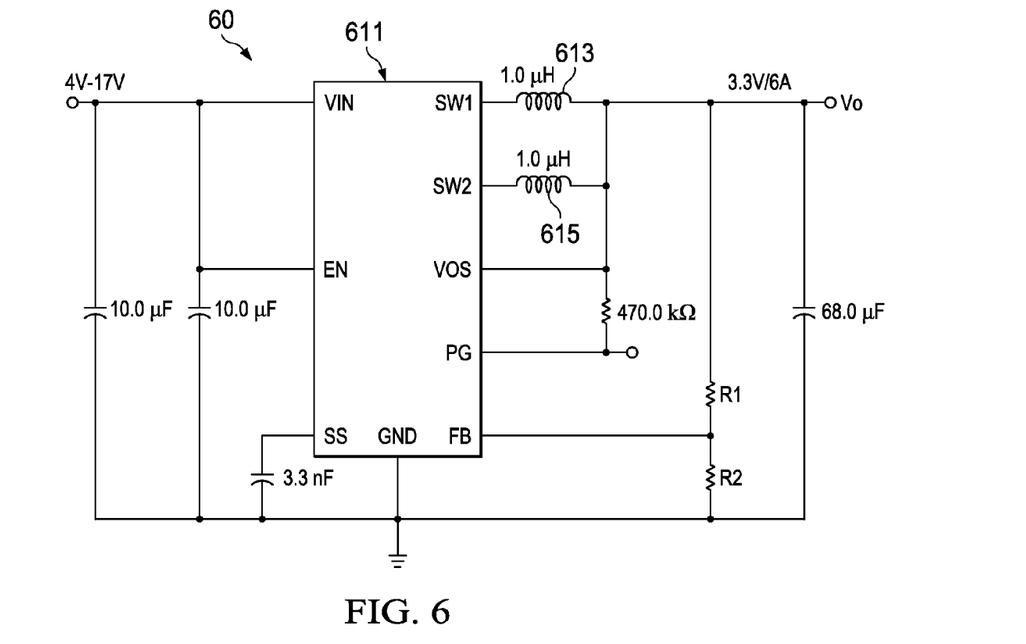
FIG. 6 illustrates in a block diagram an integrated circuit embodiment.

FIG. 6 depicts in a block diagram an integrated circuit 611 for forming a two phase step down buck converter 60 of an embodiment which incorporates an integrated shared bootstrap capacitor, as described above. The two phases are indicated by the two switching nodes SW1 and SW2, which are coupled to the inductors 613 and 615 which drive the output at node Vo. In this example, the integrated circuit 611 is configured to provide an output voltage of 3.3 Volts with 6 Amps of current from a range of input voltages that can vary from 4-17 Volts as indicated in FIG. 6.

Figure 7:
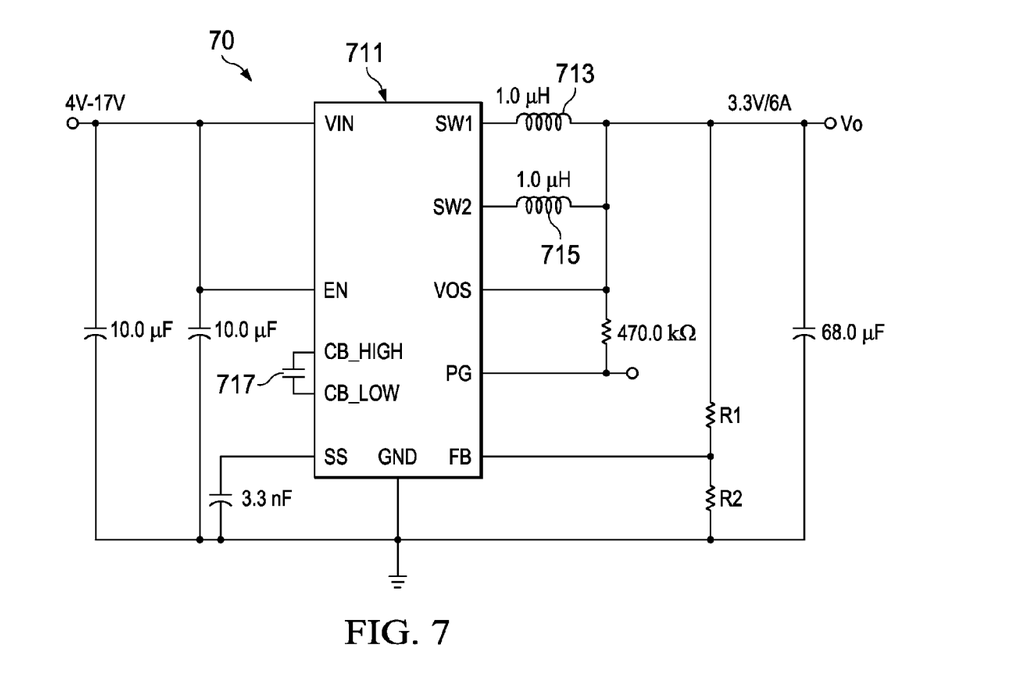
FIG. 7 illustrates in a block diagram an alternative integrated circuit embodiment.

FIG. 7 depicts in a block diagram an integrated circuit 711 for forming a two phase step down buck converter 70 of an embodiment which uses an external component capacitor for the shared bootstrap capacitor described above. In FIG. 7, the two phases are indicated by the two switching node outputs SW1 and SW2 of the integrated circuit 711. Inductors 713 and 715 are coupled in parallel to supply current to the output node Vo. The output is configured to be 3.3V as in FIG. 6, and in this example configuration, an input voltage range of 4-17 Volts in indicated. In FIG. 7, the capacitor 717 is the bootstrap capacitor. In this embodiment, the integrated circuit 711 is configured to use an external bootstrap capacitor, instead of the integrated bootstrap capacitor in FIG. 6. The terminals CB_HIGH and CB_LOW correspond to these nodes in the circuits shown in FIGS. 2, 3 and 5 above. The operation of the circuitry is not otherwise impacted by using an external component as the bootstrap capacitor. In the embodiment of FIG. 7, the buck converter circuit 70 shares the bootstrap capacitor 717 over the two switching stages corresponding to switching nodes SW1, SW2. In alterative embodiments, more switching stages are used and the bootstrap capacitor is shared over multiple stages. In other words, in FIG. 7, the indice "n" is equal to two; however, n may be a positive integer that is greater than or equal to two, including three, four or more stages.

Figure 8:
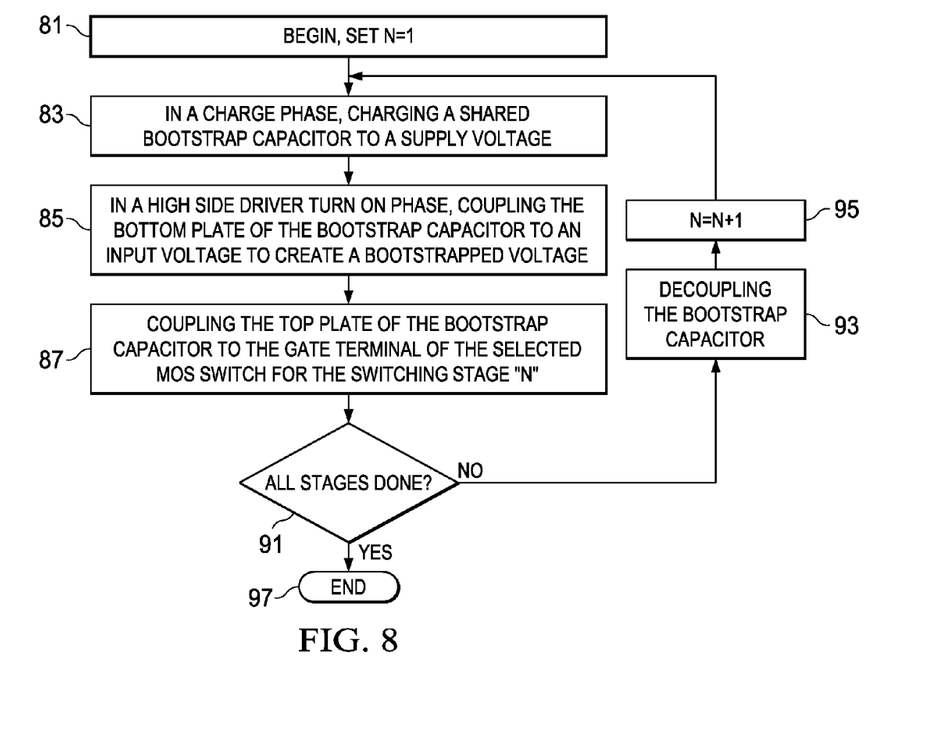
FIG. 8 illustrates in a simplified flow diagram a method embodiment.

FIG. 8 illustrates in a flow diagram a method embodiment. In step 81, the indice n is set equal to 1, and the method begins. In step 83 a bootstrap capacitor charge phase is performed, and a bootstrap capacitor is charged to a supply voltage. In step 85, a high side driver turn on phase begins. The charged bootstrap capacitor has a bottom plate coupled to a positive input voltage to create a bootstrapped voltage. At step 87, the top plate of the charged bootstrap capacitor is coupled to the gate terminal of a selected high side MOS switch for the "nth" switching stage. At step 91, a decision is made whether all stages have been performed. If there are additional switching stages that are yet to be performed, the method transitions to step 93 and the bootstrap capacitor is decoupled from the high side switch. In step 95 the indice n is incremented, to advance the method to the next stage. The method of FIG. 8 then repeats the bootstrap capacitor charge phase and the high side driver turn on phase for each of the "n" stages. For example, in a two stage case, n begins at 1, the method is performed for the first stage, the indice "n" is incremented to 2, the method is performed for the second stage, and the method then ends Although the example embodiments have been described in detail, it should be understood that various changes, substitutions and alterations can be made herein without departing from the spirit and scope of the application as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A buck converter for producing a DC output voltage from a DC input voltage, comprising: a plurality of n switching stages, wherein n is an integer greater than or equal to two, each coupled to a corresponding switching node, each of the n switching stages further comprising: a high side MOS switch coupled between an input terminal for a positive input voltage and the corresponding switching node; an inductor corresponding to each of the n switching stages coupled in parallel to each other and coupled between the corresponding switching node and an output terminal and configured for providing the DC output voltage; and high side driver circuitry configured to selectively couple a shared bootstrap capacitor to a gate terminal of a respective one of the high side MOS switches within each of the n switching stages, wherein the bootstrap capacitor is configured to charge a gate capacitance of the respective one of the high side MOS switches.

2. The buck converter of claim 1, wherein n is an integer equal to two.

3. The buck converter of claim 1, wherein the high side MOS switch in each of the n switching stages is an N-type MOS transistor.

4. The buck converter of claim 1, and further comprising bootstrap capacitor charging circuitry configured to selectively couple a top plate of the shared bootstrap capacitor to a positive supply voltage and to selectively couple a bottom plate of the shared bootstrap capacitor to a ground potential.

5. The buck converter of claim 1, and further comprising the high side driver turn on control circuitry configured to selectively couple a bottom plate of the shared bootstrap capacitor to the input terminal for a positive input voltage and to selectively couple a top plate of the shared bootstrap capacitor to a gate terminal of the high side MOS switch of a selected one of the n switching stages.

6. The buck converter of claim 5 wherein the high side driver circuitry further comprises n high side drivers corresponding to each of the n switching stages and each coupled between a top plate of the shared bootstrap capacitor and a gate terminal of a corresponding one of the high side MOS switches.

7. The buck converter of claim 6 wherein the high side drivers each further comprise a pair of back to back N-MOS transistors series coupled between the top plate of the shared bootstrap capacitor and the gate terminal of a corresponding one of the high side MOS switches, the back to back N MOS transistors having a shared gate terminal coupled to the high side driver turn on control circuitry.

8. An integrated circuit configured to provide a DC to DC voltage converter in a buck configuration, comprising: a plurality of n switching stages, wherein n is an integer greater than or equal to two, having n switching node outputs, each of the plurality of n switching stages further comprising: a high side N MOS switch device having a gate terminal and being coupled between a positive input voltage terminal and a corresponding switching node output; a low side N MOS switch device having a gate terminal and being coupled between the corresponding switching node output and a ground terminal; a high side driver that selectively couples a top plate of a bootstrap capacitor to the gate terminal of the high side N MOS switch device responsive to a control input; and high side driver control circuitry coupled to the control input of the high side driver of each of the n switching stages; whereby the bootstrap capacitor is shared between the n switching stages.

9. The integrated circuit of claim 8 and further comprising: bootstrap capacitor charging circuitry selectively coupled to the bootstrap capacitor and configured to selectively couple the top plate of the bootstrap capacitor to a positive supply voltage and to selectively couple a bottom plate of the bootstrap capacitor to a ground potential.

10. The integrated circuit of claim 8, wherein the high side driver control circuitry is configured to selectively couple the top plate of the bootstrap capacitor to the high side driver of a selected one of the n switching stages and to selectively couple a bottom plate of the bootstrap capacitor to the positive input voltage terminal.

11. The integrated circuit of claim 8, wherein each of the high side drivers in the n switching stages further comprises a pair of N MOS transistors series coupled back to back, and the pair of N MOS transistors has a common gate terminal coupled to the control input.

12. The integrated circuit of claim 8 wherein n is equal to two.

13. The integrated circuit of claim 8 wherein n is greater than or equal to two.

14. The integrated circuit of claim 8 and further comprising n inductors, each coupled to a corresponding one of the n switching outputs, the n inductors coupled in parallel between the n switching nodes and a voltage output node to form a DC voltage output terminal for a buck converter.

15. The integrated circuit of claim 8, wherein the n switching stages and the shared bootstrap capacitor are provided on a single integrated circuit.

16. The integrated circuit of claim 8, wherein the n switching stages are provided on a single integrated circuit and the shared bootstrap capacitor is provided as an external component coupled to the integrated circuit.

17. A method, comprising: charging a shared bootstrap capacitor by coupling a top plate of the shared bootstrap capacitor to a positive voltage supply while coupling a bottom plate of the shared bootstrap capacitor to a ground potential; and subsequently coupling the bottom plate of the shared bootstrap capacitor to the input voltage while simultaneously coupling the top plate of the shared bootstrap capacitor to a gate terminal of a high side N MOS switch within a selected one of n switching stages, wherein n is an integer greater than or equal to two, so as to provide a bootstrapped voltage greater than the input voltage on the gate terminal of the high side N MOS switch within the selected one of the n switching stages and thereby turn on the high side N MOS switch.

18. The method of claim 17 and further comprising:
decoupling the shared bootstrap capacitor from the selected one of the n switching stages;
subsequently recharging the shared bootstrap capacitor by again coupling a top plate of the bootstrap capacitor to the positive voltage supply while coupling a bottom plate of the bootstrap capacitor to a ground potential; and
subsequently coupling the bottom plate of the shared bootstrap capacitor to the input voltage while simultaneously coupling the top plate of the bootstrap capacitor to a gate terminal of another one of the high side N MOS switches within another selected one of the n switching stages, to provide a voltage greater than the input voltage on the gate terminal and so turn on the high side N MOS switch within the another selected one of the n switching stages; and
subsequently repeating the three above recited steps until each of the n switching stages has been coupled to the shared bootstrap capacitor while it is charged.

19. The method of claim 17, wherein subsequently coupling the bottom plate of the bootstrap capacitor to the input voltage y while simultaneously coupling the top plate of the bootstrap capacitor to a gate terminal of a selected one of the high side N MOS switch further comprises:
coupling a pair of back to back series coupled N MOS transistors between the top plate of the shared bootstrap capacitor and the gate terminal of the high side N MOS switch for the selected one of the n switching stages, and operating the pair of back to back series coupled N MOS transistors by placing a voltage greater than a predetermined gate threshold voltage at a common gate terminal of the pair of back to back series coupled N MOS transistors, so as to turn on the pair of back to back series coupled N MOS transistors.

* * * * *